United States Patent [19]

Carlson

[11] 4,226,643
[45] Oct. 7, 1980

[54] METHOD OF ENHANCING THE ELECTRONIC PROPERTIES OF AN UNDOPED AND/OR N-TYPE HYDROGENATED AMORPHOUS SILICON FILM

[75] Inventor: David E. Carlson, Yardley, Pa.

[73] Assignee: RCA Corporation, New York, N.Y.

[21] Appl. No.: 58,023

[22] Filed: Jul. 16, 1979

[51] Int. Cl.³ .................. H01L 31/04; B05D 3/06
[52] U.S. Cl. .................................. 136/258; 357/2; 357/30; 427/39; 427/74
[58] Field of Search ............... 427/39, 74; 136/89 TF; 357/2, 30

[56] References Cited

U.S. PATENT DOCUMENTS 4,064,521  12/1977  Carlson ................................. 357/2

OTHER PUBLICATIONS

R. A. Street et al. "Luminescence Studies of Plasma-Deposited Hydrogenated Silicon", *Physical Review B*, vol. 18, pp. 1880–1891 (1978).
K. J. Matysik et al. "Hydrogen Evolution from Plasma-Deposited Amorphous Silicon Films", *J. Vac. Sci. Technol.*, vol. 15, pp. 302–304 (1978).
C. C. Tsai et al. "Effect of Annealing on The Optical Properties of Plasma Deposited Amorphous Hydrogenated Silicon", *Solar Energy Materials*, vol. 1, pp. 29–42 (1979).

*Primary Examiner*—Aaron Weisstuch
*Attorney, Agent, or Firm*—Birgit E. Morris; A. Stephen Zavell

[57] ABSTRACT

The dark conductivity and photoconductivity of an N-type and/or undoped hydrogenated amorphous silicon layer fabricated by an AC or DC proximity glow discharge in silane can be increased through the incorporation of argon in an amount from 10 to about 90 percent by volume of the glow discharge atmosphere which contains a silicon-hydrogen containing compound in an amount of from about 90 to about 10 volume percent.

15 Claims, 4 Drawing Figures

METHOD OF ENHANCING THE ELECTRONIC PROPERTIES OF AN UNDOPED AND/OR N-TYPE HYDROGENATED AMORPHOUS SILICON FILM

The present invention relates to amorphous silicon solar cells. More particularly, the invention relates to a method of controlling the electronic properties of hydrogenated amorphous silicon fabricated by a glow discharge of silane. The government of the United States of America has rights in this invention pursuant to Department of Energy Contract No. EY-76-C-03-1286.

BACKGROUND OF THE INVENTION

Photovoltaic devices, such as amorphous silicon solar cells, described in U.S. Pat. No. 4,064,521, are capable of converting solar radiation into usable electrical energy. The energy conversion occurs as a result of what is well-known in the solar cell field as the photovoltaic effect. Solar radiation impinging on the solar cell and absorbed by the amorphous silicon generates electrons and holes. The electrons and holes are separated by a built-in electric field, for example, a rectifying junction in the solar cell. The separation of the electrons and holes creates the photocurrent of the solar cell.

The efficiency of the separation and collection of the holes and electrons by the built-in field is known as the collection efficiency. The collection efficiency or short circuit current as well as the fill factor of the solar cell can be improved, inter alia, by lowering the series resistance of the solar cell. This can be done by increasing the dark conductivity and photoconductivity of a layer of undoped (slightly N-type) or N-type hydrogenated amorphous silicon, thereby improving the performance of the solar cell. Thus, it would be highly desirable to increase the dark conductivity and photoconductivity of such solar cells.

SUMMARY OF THE INVENTION

The invention provides a method of increasing the dark conductivity and photoconductivity of an undoped (slightly N-type) and an N-type hydrogenated amorphous silicon layer. The improved undoped and N-type amorphous silicon layer is fabricated in an AC or DC proximity glow discharge atmosphere which contains a silicon-hydrogen containing compound in an amount of from about 90 to about 10 volume percent and argon in an amount of from about 10 to 90 volume percent.

DETAILED DESCRIPTION OF THE INVENTION

Figure 4:
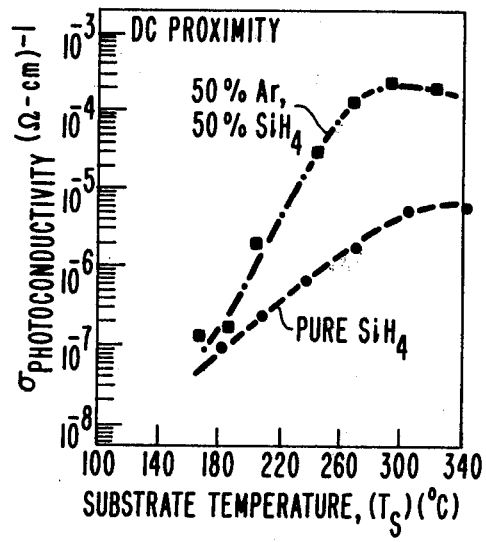
FIG. 4 illustrates the improvement in the photoconductivity of an undoped hydrogenated amorphous silicon film fabricated by a DC proximity glow discharge in an atmosphere comprising 50 percent by volume of argon and 50 percent by volume of silane.

Hydrogenated amorphous silicon solar cells were first disclosed and claimed in U.S. Pat. No. 4,064,521 to Carlson, incorporated herein by reference. FIG. 4 of the Carlson patent illustrates a proximity glow discharge apparatus which, when used in conjunction with an AC power source, is an AC proximity discharge apparatus. An AC proximity discharge is defined to mean a discharge where the substrate is located near or in the proximity of a screen electrode. In an AC proximity discharge, one terminal of the power source is connected to a screen electrode and the other terminal of the power source is connected to another electrode.

In a DC proximity discharge, the negative terminal or the DC power supply is connected to a screen cathode in the proximity of the substrate. In both the AC and DC modes of operation, the maximum opening in the screen size of the cathode is less than the cathode dark space region of the glow discharge.

Unexpectedly, N-type conductivity and/or undoped (slightly N-type conductivity) hydrogenated amorphous silicon layers fabricated by an AC or DC proximity glow discharge in the presence of argon and a silicon-hydrogen containing compound exhibit an increase in the dark conductivity and photoconductivity over similar hydrogenated amorphous silicon layers fabricated without argon. P-type layers exhibit no significant improvement or are somewhat degraded when fabricated in the presence of argon. Other inert gases will also affect the properties of the hydrogenated amorphous silicon.

The improved hydrogenated amorphous silicon layer can be deposited on substrate materials having good electrical conductivity properties and the ability to electrically contact the N-type or undoped layer of hydrogenated amorphous silicon. Suitable substrates for the undoped or N-type layers are Mo, Nb, Ta, Cr, Ti, V, and steel. The improved material can also be deposited on P-type hydrogenated amorphous silicon or have P-type hydrogenated amorphous silicon deposited thereon to form a rectifying junction such as a PN junction.

The substrate is placed in an AC proximity glow discharge apparatus and heated to from about 150° C. to about 400° C. and preferably from about 250° C. to about 350° C. An argon-silane gas mixture is introduced into the discharge atmosphere at a rate of from about 10 to about 100 standard cubic centimeters per minute (SCCM). The argon is from about 10 to about 90 volume percent of the gas mixture and silane is from about 90 to about 10 volume percent of the gas mixture. The pressure of the argon and silane gas mixture atmosphere is in the range of from about 0.3 to about 1 Torr, and preferably about 0.5 to 0.7 Torr.

Thereafter, an alternating potential with a frequency of about 60 hertz and a voltage of from about 500 volts to about 2 kilovolts root mean square (RMS) is applied across the electrodes for an AC proximity discharge. The frequency is not critical, although frequencies below 1 hertz tend to fabricate non-homogeneous structures, i.e., alternating mono-atomic layers of anodic and cathodic material. A frequency of about 60 hertz was selected because that is the available frequency of alternating current from an electrical outlet. Preferably, the voltage applied across the cathode and anode is about 1.5 kilovolts. The same deposition parameters apply for the DC mode of operation. However, the applied voltage is in the range of 700 to 1500 volts.

When fabricating a layer of N-type conductivity, the silane component of the discharge atmosphere incorporates a suitable N-type dopant in a concentration of from about 10 ppm to about 3 percent of the silane concentration. Preferably, from about $10^3$ ppm to about $10^4$ ppm of $PH_3$ in the silane component of the atmosphere is added. The overall dopant concentration in the glow discharge atmosphere will be lower depending upon the argon dilution.

Alternatively, the silicon-hydrogen source needed to fabricate the hydrogenated amorphous silicon layer can be a silicon-hydrogen-halogen containing compound as taught in "An Article and a Device Having an Amorphous Silicon Containing a Halogen and a Method of Fabrication", United States Application Ser. No. 727,659, filed Sept. 29, 1976, incorporated herein by reference. Included within a halogen is fluorine.

Figure 1:
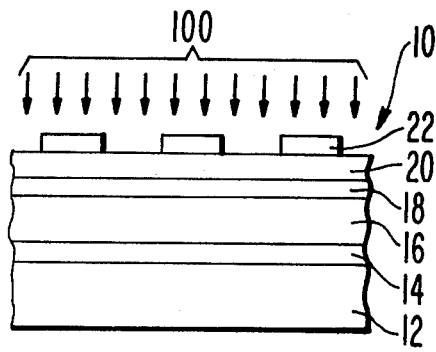
FIG. 1 illustrates an hydrogenated amorphous silicon solar cell incorporating a region of undoped and N-type hydrogenated amorphous silicon fabricated in an AC or DC proximity glow discharge containing argon and silane.

A hydrogenated amorphous silicon solar cell incorporating the improved N-type conductivity and undoped layers is illustrated as PIN type solar cell 10 in FIG. 1. Solar radiation 100 impinging on solar cell 10 provides a reference point for the incident surface of each layer. Solar cell 10 incorporates a substrate 12 which ohmically contacts a layer of N-type conductivity hydrogenated amorphous silicon 14. The N-type layer 14 assures a good ohmic contact to the substrate 12. Layer 14 has a thickness of up to about 1000 nanometers, but preferably is from about 10 to about 100 nanometers thick. Layer 16 of undoped hydrogenated amorphous silicon is fabricated on layer 14. Layer 16 is from about 200 to about 1000 nanometers thick. Layers 14 and 16 are fabricated in the presence of argon in accordance with the previously described method. Layer 18 of P-type hydrogenated amorphous silicon is fabricated on layer 16 by an AC or DC proximity glow discharge in a silane atmosphere containing from about 10 ppm to about $10^4$ ppm of $B_2H_6$.

The solar cell 10 has a transparent conductive oxide 20, TCO, and a metal grid structure 22 deposited on layer 18 to collect the photocurrent generated during illumination of solar cell 10. The solar cell is not limited to a PIN structure. Other known solar cell structures such as a Schottky barrier structure, PN structure, NIP structure, or an oxide thin P+IN structure and the like are also possible.

The improved dark conductivity and photoconductivity of layers 14 and 16 lowers the series resistance of the solar cell in accordance with the following formula:

$$R_s = l/A\sigma_p$$

wherein $R_s$ is the contribution to the series resistance in ohms from each layer, $\sigma_p$ is the conductivity of either layer 14 or 16, l is the thickness of either layer, and A is the area of the cell. An improvement in the photoconductivity of the layer of about 10 would result in a reduction of the series resistance contribution due to either layer of about 10. Assuming A=1 cm and l=100 nanometers, then $R_s$=1.0 $\Omega$ for $\sigma_p = 10^{-5}$ ($\Omega$-cm)$^{-1}$. However, if $\sigma_p$ increases by 10, then $R_s$=0.1 ohm.

The invention will be further illustrated by the following examples, but it is to be understood that the invention is not meant to be limited solely to the details described therein. Modifications which would be obvious to one of ordinary skill in the art are contemplated to be within the scope of the invention.

EXAMPLE I

A fused silica substrate coated with a Cr stripe pattern was placed in an AC proximity glow discharge apparatus and heated to from about 125° C. to about 315° C. Silane containing $PH_3$ concentration of about 2000 ppm was introduced into the apparatus. The flow ratio of the gas was about 30 SCCM. The pressure in the apparatus was about 0.6 Torr. The electrodes were energized with an AC voltage having a frequency of 60 hertz and a voltage across the electrodes of about 1.5 kilovolts (RMS) root mean square to form an N-type hydrogenated amorphous silicon layer on the substrate.

Thereafter, a second substrate was exposed to a reaction gas mixture containing 50 volume percent of argon and 50 volume percent of silane containing 2000 ppm of $PH_3$ to deposit an N-type film under similar deposition conditions. The gaseous mixture was introduced into the apparatus at a rate of about 30 SCCM.

Thereafter, the substrates containing the layers were removed from the discharge apparatus and the dark conductivity and photoconductivity were measured using the conventional 4 point probe technique. A potential of 10 volts was applied across an outer pair of chromium stripes while the current was measured with an electrometer. Another electrometer was used to measure the voltage drop across an inner pair of chromium stripes. Resistance is equal to measured voltage over current (R=V/i). The resistivity ($\rho$) of the film is determined by the formula:

$$\rho = R\,A'/l'$$

wherein R is equal to resistance, l' is equal to the distance between the inner pair of chromium stripes, and A' is equal to the thickness of the film times the length of the stripe.

Figure 2:
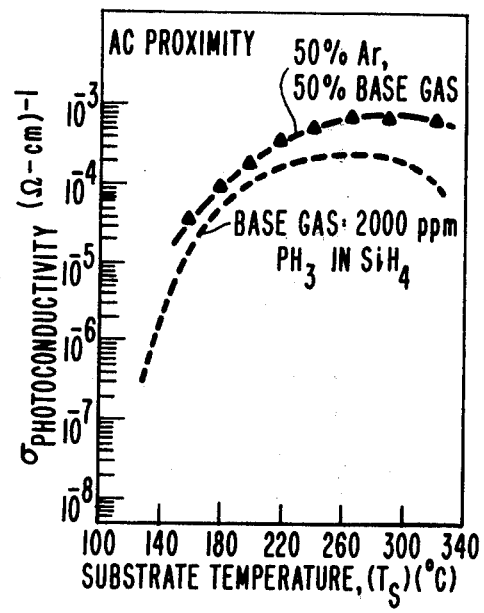
FIG. 2 illustrates the improvement of the photoconductivity of N-type hydrogenated amorphous silicon fabricated by AC proximity glow discharge in an atmosphere containing 50 percent by volume of argon and 50 percent by volume of doped silane.
Figure 3:
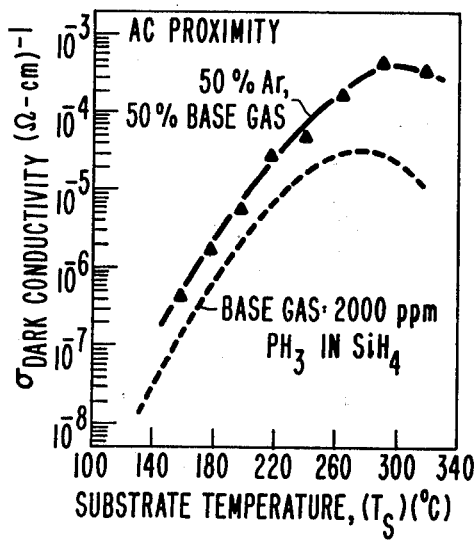
FIG. 3 illustrates the improvement in the dark conductivity of an N-type hydrogenated amorphous silicon film fabricated in an AC proximity glow discharge in an atmosphere containing 50 percent by volume of argon and 50 percent by volume of doped silane.

FIGS. 2 and 3 illustrate the increase in the dark conductivity and photoconductivity respectively of the N-type hydrogenated amorphous silicon film fabricated in an atmosphere containing 50 volume percent of argon and 50 volume percent of silane plus $PH_3$. The dashed curve represents an hydrogenated amorphous silicon layer fabricated without argon and the dashed and triangular dotted curve represents the argon silane atmosphere.

EXAMPLE II

A device was fabricated in accordance with the procedure outlined in Example I; however, the glow discharge atmosphere was 50 volume percent of argon and 50 volume percent of pure silane without conductivity modifiers. The discharge was operated in the DC mode with a power of about 1200 volts. The cathodic screen current density was about 1.0 mA/cm$^2$. The substrate temperature varied from about 160° C. to about 340° C.

The samples were measured in accordance with the technique outlined in Example I.

FIG. 4 illustrates the improvement in the photoconductivity of an undoped layer fabricated in an argon-silane atmosphere over a layer fabricated in a silane atmosphere without argon. The dashed and dotted curve represents an amorphous silicon layer fabricated in pure silane. The improved amorphous silicon layer fabricated in a 50 volume percent argon and 50 volume percent silane atmosphere is represented by the curve with dash-dots and squares.

What is claimed is:

1. A method of forming an N-type layer or an undoped hydrogenated amorphous silicon layer having increased dark conductivity and photoconductivity by the deposition of said layer in an AC or DC proximity glow discharge, said method comprising:

placing a substrate in a proximity glow discharge apparatus;

reducing the pressure to from about 0.3 to about 1 Torr;

heating the substrate to from about 150° to about 400° C.;

introducing a gaseous mixture containing from about 10 to about 90 percent by volume of argon and from about 90 to about 10 percent by volume of silane; and applying a potential across the electrodes.

2. The method according to claim 1 wherein the potential is an alternating potential having a voltage of from about 500 volts to about 2 kilovolts root mean square with a frequency equal to or greater than about 1 hertz.

3. The method according to claim 2 wherein the AC voltage is about 1.5 kilovolts root mean square.

4. The method according to claim 1 wherein the potential is a DC potential with a voltage of from about 700 to about 1500 volts.

5. The method according to claim 4 wherein the current density on a cathodic screen electrode in said proximity glow discharge apparatus is about 1 milliampere per square centimeter.

6. The method according to claim 5 wherein the DC voltage is about 1.2 kilovolts.

7. The method according to claims 3 or 5 wherein the substrate temperature is from about 250° C. to about 350° C.

8. The method according to claims 3 or 5 wherein the pressure is about 0.6 Torr.

9. The method according to claims 3 or 5 wherein the flow rate of the gas mixture is from about 10 to about 100 standard cubic centimeters per minute.

10. The method according to claim 1 wherein the silane in said glow discharge apparatus contains an N-type dopant in a concentration of from about 10 parts per million to about 3 percent.

11. The method according to claim 10 wherein the N-type dopant is $PH_3$.

12. The method according to claim 1 wherein a silicon-hydrogen-halogen-containing compound is substituted for the silane in the glow discharge atmosphere and said undoped or N-type conductivity hydrogenated amorphous silicon layer incorporates a halogen in an amount up to about 7 atomic percent.

13. The method according to claim 12 wherein said silicon-hydrogen-halogen-containing compound incorporates an N-type dopant in a concentration of from about 10 parts per million to about 3 percent of the silicon-hydrogen-halogen-containing compound.

14. In a solar cell having regions of undoped and N-type conductivity hydrogenated amorphous silicon fabricated in an AC or DC proximity glow discharge, the improvement which comprises fabricating said regions on a substrate in a glow discharge atmosphere incorporating argon in an amount from about 10 to about 90 percent by volume of the glow discharge atmosphere, and silane in an amount of from about 90 to about 10 percent by volume of the glow discharge atmosphere at a pressure of from about 0.3 to about 1 Torr, with a substrate temperature of from about 150° C. to about 400° C.

15. The solar cell according to claim 14 wherein a silicon-halogen-hydrogen-containing compound is substituted for the silane and the undoped and N-type conductivity hydrogenated amorphous silicon regions incorporate a halogen in an amount up to about 7 atomic percent.

* * * * *

UNITED STATES PATENT AND TRADEMARK OFFICE
CERTIFICATE OF CORRECTION

PATENT NO. : 4,226,643

DATED : October 7, 1980

INVENTOR(S) : David E. Carlson

It is certified that error appears in the above-identified patent and that said Letters Patent is hereby corrected as shown below:

Column 3, line 56: change "l" to --$\ell$--;

line 60: change "l" to --$\ell$--;

line 64: change "l=100" to --$\ell$=100--;

Column 4, line 37: change "l'" to --$\ell'$--;

line 39: change "l'" to --$\ell'$--.

Signed and Sealed this

Sixth Day of January 1981

[SEAL]

Attest:

SIDNEY A. DIAMOND

Attesting Officer

Commissioner of Patents and Trademarks